United States Patent [19]

Carter

[11] Patent Number: 4,923,270

[45] Date of Patent: May 8, 1990

[54] APPARATUS FOR OPTICAL WAVELENGTH DIVISION MULTIPLEXING

[75] Inventor: Andrew C. Carter, Northampton, Great Britain

[73] Assignee: Plessey Overseas Limited, Ilford, England

[21] Appl. No.: 269,913

[22] PCT Filed: Mar. 11, 1988

[86] PCT No.: PCT/GB88/00191

§ 371 Date: Nov. 9, 1988

§ 102(e) Date: Nov. 9, 1988

[87] PCT Pub. No.: WO88/07216

PCT Pub. Date: Sep. 22, 1988

[30] Foreign Application Priority Data

Mar. 13, 1987 [GB] United Kingdom ............... 8706014

[51] Int. Cl.$^5$ ............................................. G02B 6/32
[52] U.S. Cl. .................................... 350/96.18; 370/1; 372/50
[58] Field of Search ............... 350/96.15, 96.16, 96.18, 350/96.19, 96.20; 370/1, 3; 372/45, 50, 96

[56] References Cited

U.S. PATENT DOCUMENTS

| | | | |
|---|---|---|---|
| 4,464,759 | 8/1984 | Haus et al. ........................ | 372/18 |
| 4,680,767 | 7/1987 | Hakimi et al. .................... | 372/12 X |
| 4,730,327 | 3/1988 | Gordon .............................. | 372/96 X |

FOREIGN PATENT DOCUMENTS

| | | |
|---|---|---|
| 1089932 | 11/1980 | Canada . |
| 2525404 | 10/1983 | France . |
| 2178591 | 2/1987 | United Kingdom . |
| 82/01631 | 1/1982 | World Int. Prop. O. . |

OTHER PUBLICATIONS

"Design of Nondispersion Optical Feedback System Using Diffraction Girating for Semiconductor Laser Multiple Longitudinal Modes Control", by Sato et al, vol. QE-18, No. 2, Feb. 1982, pp. 155-157, IEEE Transactions of Quantum Electronics.

"Broad-Passband-Width Optical Filter for Multi--Demultiplexer Using a Diffraction Grating and a Retroreflector Prism", by Stevenage Electronics Letters, vol. 21, No. 10, 9th May 1985, pp. 423-424.

"Optical Coupling Schemes for Bidirectional 2-Wavelength Fiber Optic Systems", by Miller, Technical Digest, No. 64; Oct. 1981, pp. 41-42.

N. A. Olsson et al, "68.3 km Transmission with 1.37 Tbit km/s Capacity Using Wavelength Division Multiplexing . . . ", Electronics Let., vol. 21, No. 3, pp. 105-106, Jan. 85.

Primary Examiner—William L. Sikes
Assistant Examiner—Akm E. Ullah
Attorney, Agent, or Firm—Fleit, Jacobson, Cohn, Price, Holman & Stern

[57] ABSTRACT

Apparatus of the type comprising an optical assembly and reflection grating—for collimating light emitted by a laser and for refocussing the same onto an output waveguide. The waveguide is modified to enhance reflection of the refocussed light, which in turn dominates the resonant response of the laser. Laser resonance thus depends on geometrical factors—the relative positions of laser and waveguide and the dispersion properties of the assembly. Wavelength selectivity is improved by confining reflection to the core of the waveguide e.g. by using an embedded reflector, or further still by using an etalon pair. The laser may be used in conjunction with other lasers and/or detectors, or with retroreflectors. A multi-laser input multiplexer and single channel drop-and-add devices are described.

23 Claims, 3 Drawing Sheets

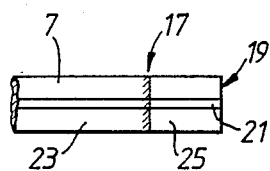
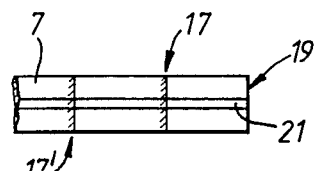
FIG. 3.   FIG. 4.
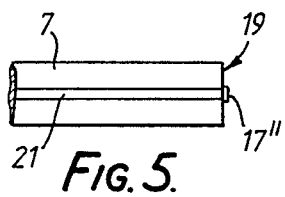
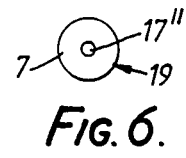
FIG. 5.   FIG. 6.
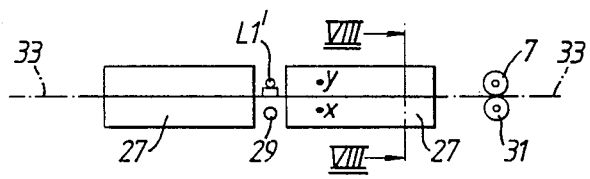
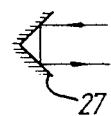
FIG. 7.   FIG. 8.
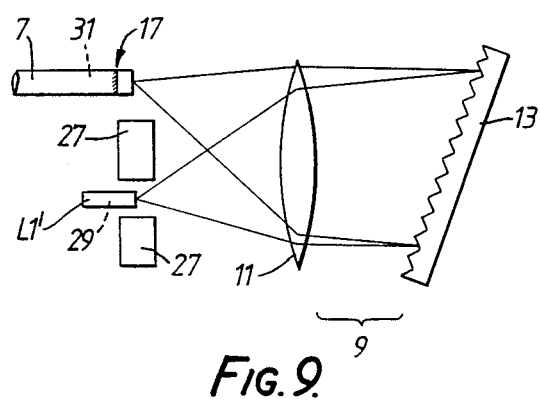
FIG. 9.

APPARATUS FOR OPTICAL WAVELENGTH DIVISION MULTIPLEXING

TECHNICAL FIELD

The present invention concerns improvements in or relating to apparatus for optical wavelength division multiplexing, in particular laser array multiplex devices, bidirectional multiplex/demultiplex devices, and drop-and-add components suitable for use in optical transmission systems.

Wavelength division multiplexing (WDM) is a well known technique for enhancing the transmission capability of an optical fibre. Instead of just a single source (laser or LED) being used to input the fibre, two or more are used, each operating at a different wavelength. Close channel spacing is desirable for optimum transmission capability. Long term stability, is also a critical factor, in particular, immunity to thermal drift is desired.

BACKGROUND ART

Semiconductor laser diodes, for example, have been used as multiplexed sources. In these the wavelength of operation depends upon the composition of the active layer material. Diodes thus with different active layer compositions have been used to generate the different wavelengths. The finite spectral width typical of such diodes, and the manufacturing tolerance on active layer composition, however, usually would limit the attainable minimum channel spacing to circa 30 nm. Closer channel spacing can be attained by using single frequency type lasers—for example distributed feedback (DFB) lasers or cleave-coupled-cavity ($C^3$) lasers. Here, however, elaborate control is required to maintain the emission wavelength of each laser correct and in tune with the multiplexer used to combine all of the outputs from the different lasers.

By way of illustration, a typical apparatus configuration is presented in FIG. 1. This has the form of a ten-channel multiplexing device 1. In this arrangement, ten fixed-wavelength lasers L1 to L10, are combined in an input linear array 3 by means of coupling fibres 5. This array 3, which also includes a common output fibre 7 is located in the focal plane of Littrow mount optical assembly 9 comprised of a collimating and focussing lens 11 and a dispersive member, a reflective grating 13. Light emissions from the individual lasers L1 to L10 are collimated, diffracted and refocussed onto the common output fibre 7. It will be appreciated that in this arrangement, the emission wavelengths and array geometry must be carefully matched to ensure that all emissions are diffracted to a common focus.

Such an arrangement, as described above, is detailed in the following article: "68.3 km transmission with 1.37 Tbit km/s capacity using wavelength division multiplexing of ten single frequency lasers at 1.5 μm", by Olsson, N. A. et al., published in Electronics Letters Volume 2, Number 3 pages 105-106 (1985). There, the authors describe an arrangement in which the selected ten lasers were of the hetero-epitaxially ridge overgrown (HRO) distributed feedback (DFB) laser type. These were made with a second-order diffraction grating and with both facets cleaved. The wavelength distribution of the lasers, which were selected from wafers of different design wavelengths, was between 1.529 and 1.561 μm.

Wafer selection, as above, is an expensive and time-consuming procedure and clearly is not commercially practical for mass production. Long term stability also is likely to be a severe problem in this type of arrangement.

DISCLOSURE OF THE INVENTION

The present invention provides an alternative approach and is intended to obviate the need for such critical selection.

In accordance with the invention thus there is provided an apparatus for optical wavelength division multiplexing, apparatus of the type comprising:
- an optical assembly for collimating dispersing and focussing light;
- one laser, at least, effectively located at or near a focus of this assembly; and,
- an optical waveguide, located at or near a common and conjugate focus of this assembly and arranged thus to receive light emitted from said one laser; wherein,
- the optical waveguide is adapted by the provision of reflection enhancement means so to reflect light emitted by said one laser and to control thereby the resonant emission thereof.

In the apparatus aforesaid the resonant wavelength of the one laser is uniquely determined according to the spatial dispersive characteristics of the optical assembly and by the fixed position of the laser relative to this assembly. Since light is inevitably reflected from an aperture of finite size, the reflected light will be restricted to a finite range of wavelength so that at worst the emission may include multiple longitudinal mode content. Greater selectivity, however, can be achieved by modifying the reflection and transmission characteristics of the front facet of the laser, or alternatively by design of the reflection enhancement means—e.g. this could be of etalon form; in each case resonant coupled cavities are defined. Whichever the case, it is clearly an advantage to restrict the size of the reflection aperture. Where the waveguide has the form of a fibre, it is convenient to employ an embedded reflector and to confine reflection thus to the core of the fibre.

The one laser aforesaid may be located with its front end facet at or near the focus. Alternatively it may be displaced from this focus but coupled thereto by means of a fibre or other waveguide. The term "effectively located" shall be construed accordingly.

The one laser may be combined with one or more additional lasers and assembled, either directly or with connective waveguides, to provide an array interface. The different wavelengths of each laser then will depend upon relative position in the focal plane.

The one laser may likewise be combined with one or more detectors to provide a bidirectional transmission device.

The one laser may be combined with one detector and with one or more retro-reflectors to form a drop-and-add component.

BRIEF INTRODUCTION OF THE DRAWINGS

In the accompanying drawings:

FIGS. 3 and 4 show, in enlarged plan view, two optical fibre waveguides, respectively, each modified for use in the apparatus depicted in the preceding figure;

FIGS. 5 and 6 show in enlarged plan view and in cross-section an optical fibre waveguide, modified in an alternative manner, for use in the apparatus of FIG. 2 preceding;

FIGS. 7, 8 and 9 show in side elevation, cross-section and plan-view respectively, a single channel drop-and-add component, apparatus likewise in accord with this invention;

DESCRIPTION OF PREFERRED EMBODIMENTS

In order that this invention might be better understood, embodiments thereof will now be described and reference will be made to FIGS. 2 to 11 of the accompanying drawings. The description that follows is given by way of example, only.

Figure 1:
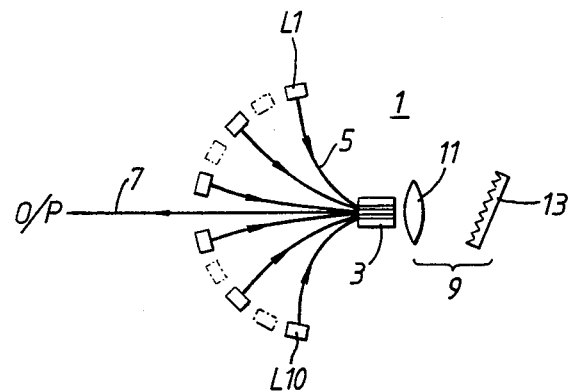
FIG. 1 is a schematic drawing showing a conventional arrangement of lasers and a multiplexing optical assembly.
Figure 2:
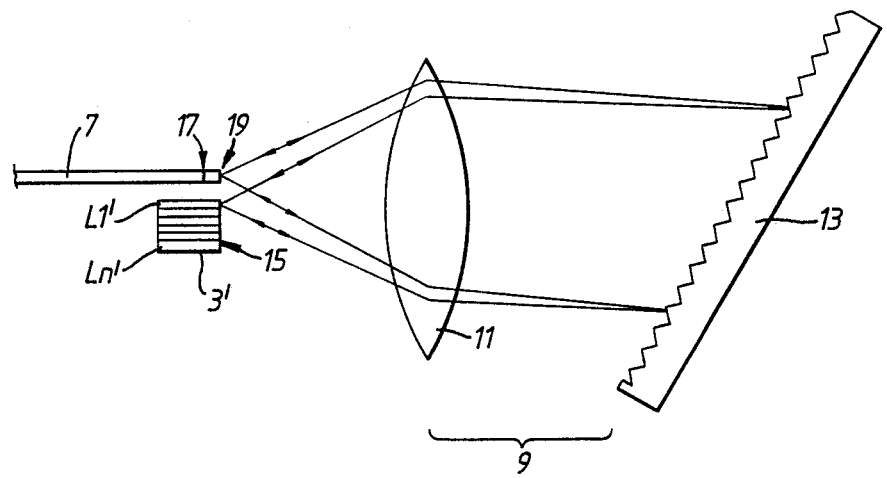
FIG. 2 is a schematic drawing showing apparatus in accord with this invention.

The apparatus, as shown in FIG. 2, comprises a Littrow mount optical assembly 9 with a collimating and focussing lens 11 and inclined reflection grating 13, as in the conventional assembly previously described. A number of laser sources L1' to Ln' are assembled in the form of a linear array 3' and are positioned in the focal plane of the collimating lens 11. These sources have the form of standard Fabry-Perot devices, all of nominally the same centre wavelength. Each is coated on its output facet 15 with a nominally anti-reflection film such that lasing wavelength (i.e. resonance) shall be determined by external feedback rather than from the laser cleaved mirror facets. Each laser L1' to Ln' thus can be regarded more as a broad-band optical gain medium under these conditions.

An optical waveguide, a fibre 7, is located in the same focal plane at a common conjugate focus corresponding to each of the lasers L1' to Ln'. This fibre 7, as shown, incorporates an embedded reflector 17, which is displaced a small distance from the front end 19 of the fibre 7. A wavelength selective external cavity, which then defines the resonance wavelength, is formed by the lens 11, the grating 13 and the reflector 17, as shown. The reflector 17 within the fibre is partial, enabling power to be coupled out of the assembly 9 into the fibre 7. The reflector 17 is shown embedded within the fibre 7 as it is desirable to confine enhanced reflection to a restricted aperture, this corresponding to the core region 21 of the fibre 7. This composite construction may be assembled from lengths of fibre 23, 25 which have been abutted together after deposition of a gold metal or similar reflecting film 17 on the polished or cleaved end surface of one of the fibre lengths 23 (See FIG. 3). An alternative construction is shown in FIGS. 5 and 6. Here the end face 19 of the fibre 7 has been masked and a reflecting film 17" located on the exposed face of the core 21. This latter construction, however, would be more difficult to manufacture.

The individual lasers L1' to Ln' within the array will resonate (lase) at different wavelengths as light diffracted and reflected by the grating is focussed at different positions in the focal plane. The laser element spacing and the grating dispersion thus are chosen to give a predetermined and suitable channel spacing.

It is noted that the grating 13 of the assembly 9 acts both as a multiplexing component and as a wavelength selective element controlling the laser wavelengths.

It will be further realized that as the laser tuning is governed essentially by geometric factors—i.e. array spacing and grating geometry, the apparatus is relatively immune to effects of temperature drift and the like.

Wavelength selectivity can be further improved by tailoring the transmittance/reflectance of the front facet 15 of each laser. Thus in place of the anti-reflection film, a partially reflecting film may be substituted. This has the effect of defining coupled cavities, the body cavity of the laser and the external cavity. Emission at one of the longitudinal resonant modes would in this case be enhanced.

It is noted that the components of the array 3' need not all be sources. Optical detectors (or possibly lasers operated as detectors) could be used on some channels—i.e. at different array locations, to give a bidirectional transmission capability over the fibre.

In the single-channel drop-and-add device shown in FIGS. 7 and 9, a Fabry-Perot type laser L1' is combined with longitudinal retroreflectorss 27, a detector 29, and two optical fibre waveguides namely, an output optical fibre 7 and an input optical fibre 31. The laser L1' and the detector, as also the input and output fibres 31 and 7 are located equidistant and symmetrically each side of the axis 33 of the retroreflectors 27. In this arrangement light of a given arbitrary wavelength emanating from the input fibre 31, is collimated and focussed to a point x on the retroreflector 27, reflected to another and corresponding point y on the retroreflector, and then collimated and refocussed onto the output fibre 7. At one particular wavelength, however, light emanating from the input fibre 31 is directed onto the detector 29. At this same wavelength, light is coupled between the laser L1' and the output fibre 7.

It will be noted that additional drop-and-add channels may be implemented by the inclusion of additional laser-detector pairs at other points in the focal plane.

As described, the laser L1' may resonante at more than one longitudinal mode of the external cavity. This may prove a problem for the longest systems envisaged, since dispersion in the fibre will inevitably lead to mode separation and interference. One remedy is to modify the laser reflectance, as discussed above. An alternative solution, however, would be to adopt an etalon structure in the output fibre 7, in place of a single reflector 17, e.g. as shown in FIG. 4 where two spaced etalon reflectors 17, 17' are embedded in the fibre 7.

An alternative to using a fibre output guide 7 is to use some form of integrated optical chip (lithium niobate, or III-V compound semiconductor—e.g. GaAs/GaAlAs) which could also perform additional functions. The laser array 3' could also be included on this chip if desired.

Figure 10:
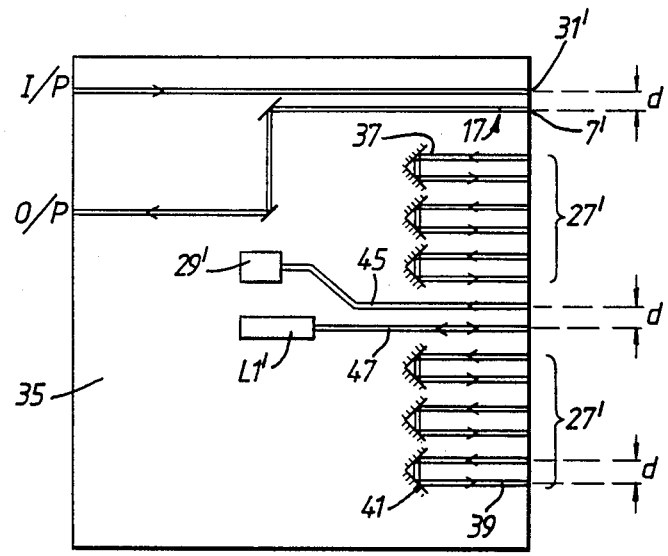
FIG. 10 is a schematic plan view of an optical integrated circuit implementation of a drop-and-add component similar to that shown in the preceding FIGS. 7 to 9; and, FIG. 11 is an enlarged plan view showing a retro-reflective waveguide element suitable for incorporation in the integrated circuit shown in the preceding Figure.
Figure 11:
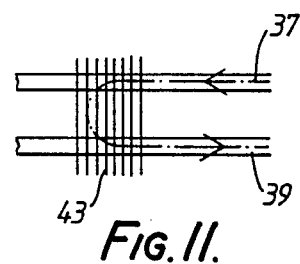

An integrated circuit implementation of the drop-and-add device is shown in FIG. 10. Here the input and output waveguides 31', 7', the retroreflectors 27' and the laser L1' and detector 29' are defined in an optical chip 35. Each retro-reflector element comprises a pair of waveguides 37, 39 which are coupled either by means of end mirrors 41 (FIG. 10) or by a grating 43 of a suitable length (FIG. 11). It will be noted that the input and output waveguides are spaced a fixed distance "d"

apart and that the retroreflector pairs 37, 39 and detector and laser guides 45, 47 are spaced by the same distance "d". This ensures that the laser L1' and output guide 7', as well as the detector 29' and input guide 31' are coupled for the same wavelength. Also, the input and output guides 31', 7' and corresponding guides 37, 39 of any one retroreflector element are likewise coupled for the same respective wavelength.

It will be appreciated that the invention is not restricted to the particular arrangements discussed above by way of example. In particular, the optical assembly may comprise alternative components, e.g. several lenses, transmission gratings, prisms, mirrors, etc. and the arrangement is not restricted to the Littrow configuration. For some applications, transmissive rather than reflective optical assembly configurations could prove beneficial and are not precluded from the general scope of this invention.

I claim:

1. Apparatus for optical wavelength division multiplexing comprising:
    an optical assembly for collimating, dispersing, and focusing light;
    one laser located near a focus of said assembly, wherein said one laser is provided in combination with one or more additional lasers of like type and of nominally the same center wavelength, these lasers being assembled to provide an array interface and all being effectively located at or near corresponding focii of the optical assembly; and
    an optical waveguide, located near a common and conjugate focus of said assembly and arranged to receive light emitted from said one laser, characterized in that:
    the optical waveguide is adapted by the provision of reflection enhancement means to reflect light emitted by said one laser and to control the resonant emission thereof.

2. Apparatus, as claimed in claim 1, wherein the laser is of Fabry-Perot type.

3. Apparatus, as claimed in claim 2, wherein the laser has a front facet that is coated with an antireflection film.

4. Apparatus, as claimed in claim 2, wherein the laser has a front facet that is coated with a partially reflecting film, the body cavity of the laser and the external cavity being coupled as resonant cavities.

5. Apparatus as claimed in claim 1, wherein the one laser is provided in combination with one or more detectors, and in the form of a focal plane array.

6. Apparatus for optical wavelength division multiplexing comprising:
    an optical assembly for collimating, dispersing, and focusing light;
    one laser located near a focus of said assembly, wherein said one laser is provided in combination with one or more retroreflectors and a corresponding detector all effectively located at or near a common focal plane of the optical assembly, the optical waveguide and another optical waveguide paired therewith being located at conjugate focii to serve thus as a drop and add device; and
    an optical waveguide, located near a common and conjugate focus of said assembly and arranged to receive light emitted from said one laser, characterized in that:
    the optical waveguide is adapted by the provision of reflection enhancement means to reflect light emitted by said one laser and to control the resonant emission thereof.

7. Apparatus, as claimed in claim 6, wherein the optical assembly is such that the common focal plane and said conjugate focii are coplanar.

8. Apparatus, as claimed in claim 7, wherein both optical waveguides and each retroreflector are embodied as part of an optical integrated circuit.

9. Apparatus, as claimed in claim 8, wherein the or each laser and each corresponding detector likewise are embodied as part of the same said optical integrated circuit.

10. Apparatus, as claimed in claim 7, wherein the or each waveguide has the form of an optical fibre.

11. Apparatus, as claimed in claim 10, wherein the optical fibre includes an embedded reflector, which latter serves as said reflector enhancement means.

12. Apparatus, as claimed in claim 6, wherein said one optical waveguide has the form of an optical fibre, which fibre includes a pair of embedded and spaced etalon reflectors.

13. An apparatus for optical wavelength division multiplexing comprising:
    an optical assembly for collimating, dispersing, and focusing light;
    one laser effectively located at a focus of this assembly, wherein said one laser is provided in combination with one or more additional lasers of like type and of nominally the same center wavelength, said lasers being assembled to provide an array interface and all being effectively located at or near corresponding focii of the optical assembly; and said one laser is provided in combination with one or more retroreflectors and a corresponding detector all effectively located at or near a common focal plane of the optical assembly, the optical waveguide and another optical waveguide paired therewith being located at conjugate focii to serve thus as a drop and add device; and
    an optical waveguide, located near a common and conjugate focus of said assembly and arranged to receive light emitted from said one laser, characterized in that:
    the optical waveguide is adapted by the provision of reflection enhancement means to reflect light emitted by said one laser and to control the resonant emission thereof.

14. Apparatus, as claimed in claim 13, wherein the laser is of Fabry-Perot type.

15. Apparatus, as claimed in claim 14, wherein the laser has a front facet that is coated with anti-reflection film.

16. Apparatus, as claimed in claim 14, wherein the laser has a front facet that is coated with a partially reflecting film, the body cavity of the laser and the external cavity formed of the optical assembly and reflection enhancement means being coupled as resonant cavities.

17. Apparatus as claimed in claim 13, wherein the one laser is provided in combination with one or more detectors, and in the form of a focal plane array.

18. Apparatus as claimed in claim 13, wherein the optical assembly is such that the common focal plane and said conjugate focii are coplanar.

19. Apparatus as claimed in claim 18, wherein both optical waveguides and each retroreflector are embodied as part of an optical integrated circuit.

20. Apparatus as claimed in claim 19, wherein each laser and each corresponding detector are embodied as part of the same optical integrated circuit.

21. Apparatus as claimed in claim 13, wherein each waveguide has the form of an optical fibre.

22. Apparatus as claimed in claim 21, wherein the optical fibre includes an embedded reflector which serves as said reflector enhancement means.

23. Apparatus as claimed in claim 13, wherein said one optical waveguide has the form of an optical fiber which includes a pair of embedded and spaced etalon reflectors.

* * * * *